(12) United States Patent
Izumi et al.

(10) Patent No.: US 12,411,184 B2
(45) Date of Patent: *Sep. 9, 2025

(54) BATTERY MANAGEMENT SYSTEM AND BATTERY MANAGEMENT METHOD FOR PREDICTION, SELECTION AND CHARGING

(71) Applicant: TOYOTA JIDOSHA KABUSHIKI KAISHA, Toyota (JP)

(72) Inventors: Junta Izumi, Nagoya (JP); Kenji Kimura, Nagoya (JP); Masakazu Habu, Toyota (JP); Masanosuke Sufu, Toyota (JP); Makito Muramatsu, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 596 days.

This patent is subject to a terminal disclaimer.

(21) Appl. No.: 17/694,776

(22) Filed: Mar. 15, 2022

(65) Prior Publication Data

US 2022/0308120 A1 Sep. 29, 2022

(30) Foreign Application Priority Data

Mar. 23, 2021 (JP) .............................. 2021-048299

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3644* (2013.01); *G01R 31/385* (2019.01); *G01R 31/396* (2019.01)

(58) Field of Classification Search
CPC .................................................. G01R 31/392
(Continued)

(56) References Cited

U.S. PATENT DOCUMENTS 8,996,241 B2 * 3/2015 Uchida ............... H01M 10/425
701/29.6
10,044,069 B2 8/2018 Despesse
(Continued)

FOREIGN PATENT DOCUMENTS

CN 102834727 A 12/2012
EP 2 645 515 A2 10/2013
(Continued)

OTHER PUBLICATIONS

Sep. 23, 2024 Office Action issued in U.S.Appl. No. 17/681,172.
Dec. 3, 2024 Office Action issued in U.S. Appl. No. 17/695,897.
Dec. 6, 2024 Office Action issued in U.S. Appl. No. 17/699,640.

*Primary Examiner* — Yalkew Fantu
(74) *Attorney, Agent, or Firm* — Oliff PLC

(57) ABSTRACT

The battery cellar includes a storage cabinet that stores a plurality of used batteries, a power converter (an AC/DC converter and a DC/DC converter) electrically connected between the plurality of used batteries stored in the storage cabinet and a power system, and a server that controls the power converter to charge or discharge the plurality of batteries in response to a demand response request from the power system. The server selects, from the plurality of used batteries, a first battery, the degradation degree of which has reached a reference value, and a second battery, the degradation degree of which does not reach the reference value but is predicted to reach the reference value within a predetermined period, as replacement target batteries.

4 Claims, 10 Drawing Sheets

(51) Int. Cl.
*G01R 31/385* (2019.01)
*G01R 31/396* (2019.01)

(58) Field of Classification Search
USPC .......................................................... 320/137
See application file for complete search history.

(56) References Cited

U.S. PATENT DOCUMENTS

| | | |
|---|---|---|
| 2011/0140648 A1 | 6/2011 | Lee |
| 2012/0249057 A1 | 10/2012 | Abe et al. |
| 2013/0030739 A1 | 1/2013 | Takahashi et al. |
| 2013/0285612 A1 | 10/2013 | Okuda |
| 2015/0171641 A1 | 6/2015 | Sato |
| 2015/0349387 A1 | 12/2015 | Inaba et al. |
| 2016/0109916 A1* | 4/2016 | Li ............................ H02J 7/35 700/295 |
| 2017/0205861 A1 | 7/2017 | Matsuda |
| 2017/0366023 A1 | 12/2017 | Tanaka et al. |
| 2019/0305386 A1 | 10/2019 | Lee et al. |
| 2020/0200826 A1* | 6/2020 | Izumi ....................... G06N 3/08 |
| 2020/0209319 A1* | 7/2020 | Mitsui ................... H01M 10/42 |
| 2021/0168964 A1 | 6/2021 | Nakaya |
| 2021/0249701 A1 | 8/2021 | Shine et al. |
| 2021/0265850 A1 | 8/2021 | Okino |
| 2022/0196753 A1 | 6/2022 | Tong |
| 2022/0305925 A1 | 9/2022 | Izumi et al. |
| 2022/0311063 A1* | 9/2022 | Izumi ................. G01R 31/3842 |
| 2022/0311248 A1 | 9/2022 | Izumi et al. |
| 2022/0311261 A1 | 9/2022 | Izumi et al. |
| 2022/0382662 A1* | 12/2022 | Hung .................. G06F 11/3476 |

FOREIGN PATENT DOCUMENTS

| | | |
|---|---|---|
| EP | 3 817 184 A1 | 5/2021 |
| JP | 2010-066229 A | 3/2010 |
| JP | 2013-211944 A | 10/2013 |
| JP | 2015-186290 A | 10/2015 |
| JP | 2016-117354 A | 6/2016 |
| JP | 2017-229137 A | 12/2017 |
| JP | 2018-205873 A | 12/2018 |
| WO | 2011/125213 A1 | 10/2011 |
| WO | 2013/129499 A1 | 9/2013 |
| WO | 2016/051701 A1 | 4/2016 |
| WO | 2019/181659 A1 | 9/2019 |
| WO | 2020/004053 A1 | 1/2020 |

* cited by examiner

FIG.5

| BATTERY ID | MODEL NUMBER | PRODUCTION DATE | SOC | FULL CHARGE CAPACITY | INTERNAL RESISTANCE | RANK | DEGRADATION EVALUATION TIME | STORAGE POSITION | REPLACEMENT REQUIRED OR NOT |
|---|---|---|---|---|---|---|---|---|---|
| | | | | | | | | | |
| | | | | | | | | | |
| | | | | | | | | | |
| . . . | | | | | | | | | |

BATTERY MANAGEMENT SYSTEM AND BATTERY MANAGEMENT METHOD FOR PREDICTION, SELECTION AND CHARGING

This non-provisional application is based on Japanese Patent Application No. 2021-048299 filed on Mar. 23, 2021 with the Japan Patent Office, the entire contents of which are hereby incorporated by reference.

BACKGROUND

Field

The present disclosure relates to a battery management system and a battery management method.

Description of the Background Art

Japanese Patent Laying-Open No. 2018-205873 describes that a user of a battery electric vehicle equipped with a battery suitable for an electric power storage system is prompted to replace the battery.

SUMMARY

In recent years, vehicles equipped with battery packs for driving have been spread rapidly. Therefore, the number of used batteries recovered along with the repurchase of new vehicles and the dismantling of used vehicles are increasing. From the viewpoint of promoting sustainable development goals (SDGs), it is desired to recycle the used batteries by recovering the used batteries and manufacturing a new battery pack from the recovered used batteries. However, the present inventors have found that recycling the used batteries may confront the following problems Batteries are stored in a distribution center or the like before sold. It is costly to properly store batteries. In addition, the batteries may be stored in the distribution center for a certain period (storage period) before they are shipped out of the distribution center. Therefore, it is desirable to effectively utilize the batteries during the storage period.

Therefore, it is conceivable to store and manage a plurality of batteries in a storage cabinet, and to charge or discharge the plurality of batteries in response to a demand response request from a power system, which allows an administrator of the batteries to receive a payment from an administrator of the power system (typically, a power company).

In the case of new batteries, the performance thereof may be substantially uniformly managed, whereas in the case of used batteries, the performance (degradation degree) thereof varies greatly. When a battery is charged or discharged as described above, the battery degrades accordingly. Therefore, regarding the plurality of batteries stored in the storage cabinet, it is desirable to replace a part of batteries that have degraded to a certain extent with other batteries that do not degrade to such extent. However, the replacement of batteries requires labor and cost.

The present disclosure has been made in order to solve the aforementioned problems, and an object of the present disclosure is to provide a battery management system and a battery management method capable of reducing labor and cost for replacing a battery.

(1) A battery management system according to an aspect of the present disclosure includes a storage cabinet that stores a plurality of batteries, a power converter electrically connected between the plurality of batteries stored in the storage cabinet and a power system, and a server that controls the power converter to charge or discharge the plurality of batteries in response to a demand response request from the power system. The server selects, from the plurality of batteries, a first battery, the degradation degree of which has reached a reference value, and a second battery, the degradation degree of which does not reach the reference value but is predicted to reach the reference value within a predetermined period, as replacement target batteries.

(2) The first battery include a battery, the full charge capacity of which is smaller than a reference capacity. When replacing the first battery, the server selects, as the replacement target batteries, the second battery, the full charge capacity of which is greater than the reference capacity but is predicted to become smaller than the reference capacity within the predetermined period, in addition to the first battery.

According to the configurations (1) and (2), the second battery, the degradation degree of which does not reach the reference value but is predicted to reach the reference value within a predetermined period is selected as the replacement target battery. In other words, at the time of replacing a first battery, the degradation degree of which has reached the reference value, the batteries which are required to be replaced in the near future are also replaced. Thus, it is possible to reduce the number of replacements of the batteries, which makes it possible to reduce labor and cost for replacing the batteries.

(3) When the number of batteries, the full charge capacity of each is predicted to become smaller than the reference capacity within the predetermined period is larger than a predetermined number, the server preferentially selects a battery having a smaller full charge capacity over a battery having a larger full charge capacity as the replacement target battery.

(4) When the number of batteries, the full charge capacity of each is predicted to become smaller than the reference capacity within the predetermined period is larger than the predetermined number, the server selects the batteries in the ascending order of full charge capacity as the replacement target batteries.

According to the configurations (3) and (4), a battery having a smaller full charge capacity is preferentially replaced. Accordingly, since the recovery amount of the full charge capacity before and after replacement is increased, it is possible to increase the payment obtained from the administrator of the power system along with the charging/discharging of the batteries.

(5) A battery management method according to another aspect of the present disclosure is a battery management method using a server. The management method includes a first step and a second step. In the first step, the server charges or discharges a plurality of batteries stored in a storage cabinet in response to a demand response request from a power system. In the second step, the server selects, from the plurality of batteries, a first battery, the degradation degree of which has reached a reference value as replacement target batteries. In the selecting step (the second step), the server selects, as the replacement target batteries, a second battery, the degradation degree of which does not reach the reference value but is predicted to reach the reference value within a predetermined period, in addition to the first battery.

Similar to the configuration (1), according to the method (5), it is possible to reduce labor and cost for replacing the batteries.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5 is a diagram illustrating an example data structure of a battery;

DESCRIPTION OF THE PREFERRED EMBODIMENTS

Figure 1:
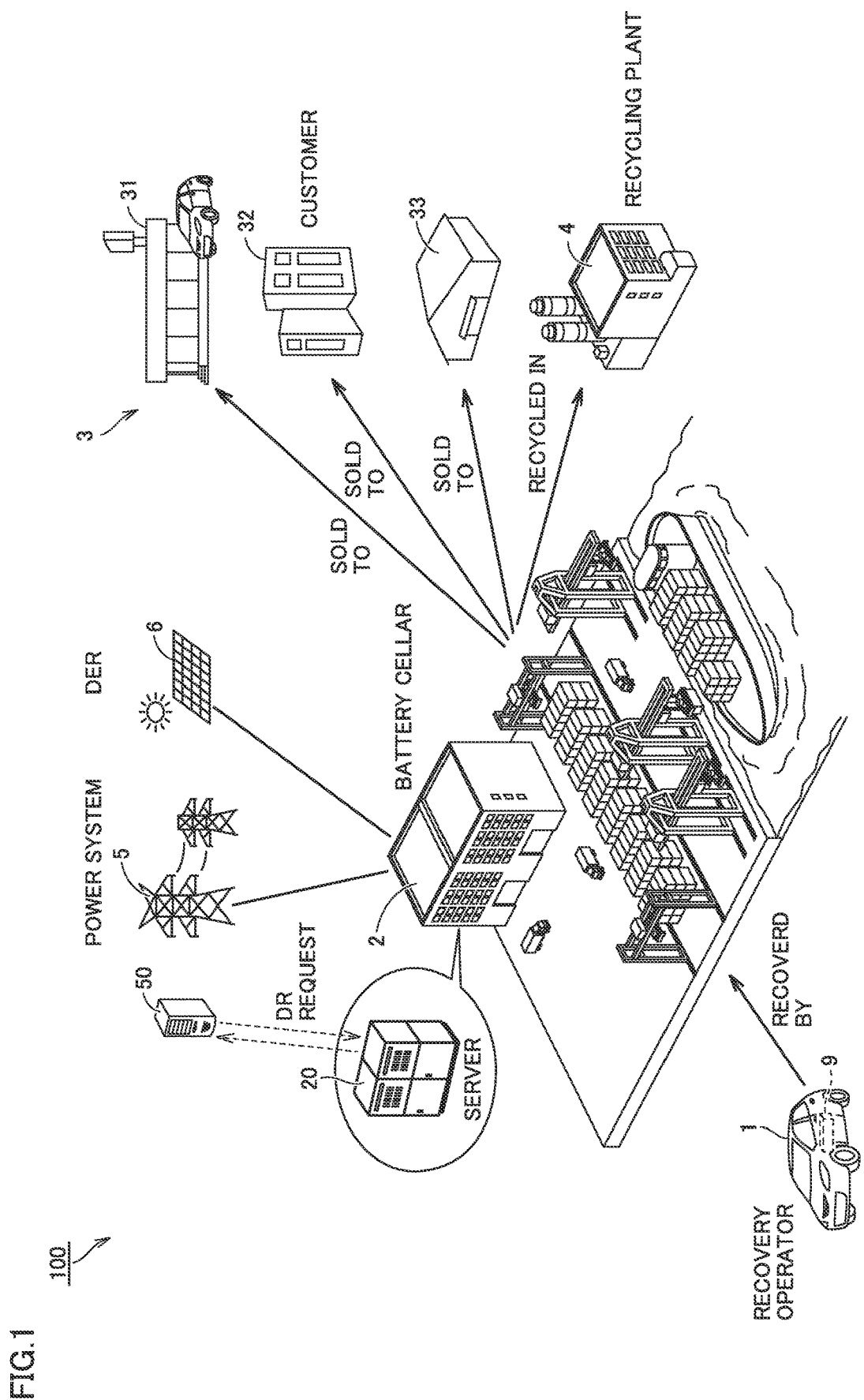
FIG. 1 is a diagram illustrating an example distribution model of a battery pack according to the present embodiment.

In the embodiments of the present disclosure, the charging/discharging of a battery means at least one of the charging or the discharging of the battery. In other words, the charging/discharging of a battery is not limited to both the charging and the discharging of the battery, it may be the charging of the battery alone or the discharging of the battery alone.

In the embodiments of the present disclosure, a battery pack includes a plurality of modules (also referred to as blocks or stacks). The plurality of modules may be connected in series or may be connected in parallel to each other. Each module includes a plurality of cells (single cells).

Generally, "recycling" of a battery pack is roughly classified into reuse, rebuild, and material recycling of the battery pack. In the case of reuse, a recovered battery pack is shipped out as it is as a reuse product after necessary inspections. In the case of rebuilt, the recovered battery pack is firstly dismantled into modules, and usable modules (modules that may be used after performance recovery) among the dismantled modules are combined to manufacture a new battery pack. The manufactured new battery pack is shipped out as a rebuilt product after necessary inspections. On the other hand, in the case of material recycling, any recyclable materials (resources) are recycled from each cell, and the recovered battery pack is not used to manufacture a new battery pack.

In the embodiments described below, the battery pack recovered from the vehicle is firstly dismantled into modules. Then, various processes are performed on each module. In other words, in the following description, a recyclable used battery means a rebuildable module. However, it is not necessary to dismantle a battery pack into modules. Depending on the configuration or the degradation degree of a battery pack, the battery pack may be reused without being dismantled into modules.

Hereinafter, embodiments of the present disclosure will be described in detail with reference to the drawings. In the drawings, the same or corresponding portions are denoted by the same reference numerals, and the description thereof will not be repeated.

EMBODIMENTS

<Battery Distribution Model>

FIG. 1 is a diagram illustrating an example distribution model of a battery pack according to the present embodiment. Hereinafter, the example distribution model illustrated in FIG. 1 will be referred to as the "battery distribution model". The battery distribution model 100 includes a recovery operator 1, a battery cellar 2, a customer 3, a recycling plant 4, a power system 5, and a distributed energy resource (DER) 6.

The recovery operator 1 recovers used battery packs (used batteries 9) from a plurality of vehicles. The recovery operator 1 may be a vehicle dealer or a vehicle dismantling operator. In the present embodiment, each used battery 9 is attached with identification information (battery ID) (see FIG. 5). Therefore, in the battery distribution model 100, the battery ID may be used to identify a used battery 9, manage data of a used battery 9 (battery data to be described later), and track a used battery 9 in the distribution path.

The battery cellar 2 is a facility for appropriately storing the used batteries 9 recovered by the recovery operator 1, which is similar to a wine cellar for storing bottles of wine under a controlled temperature and humidity. In the example illustrated in FIG. 1, the battery cellar 2 is arranged in a distribution center near a harbor. The battery cellar 2 includes a server 20 for managing data related to the used batteries 9, and a plurality of storage cabinets 21. The battery cellar 2 corresponds to the "battery management system" according to the present disclosure. The batteries stored in the battery cellar 2 are not limited to the used batteries, and may include new batteries.

Figure 2:
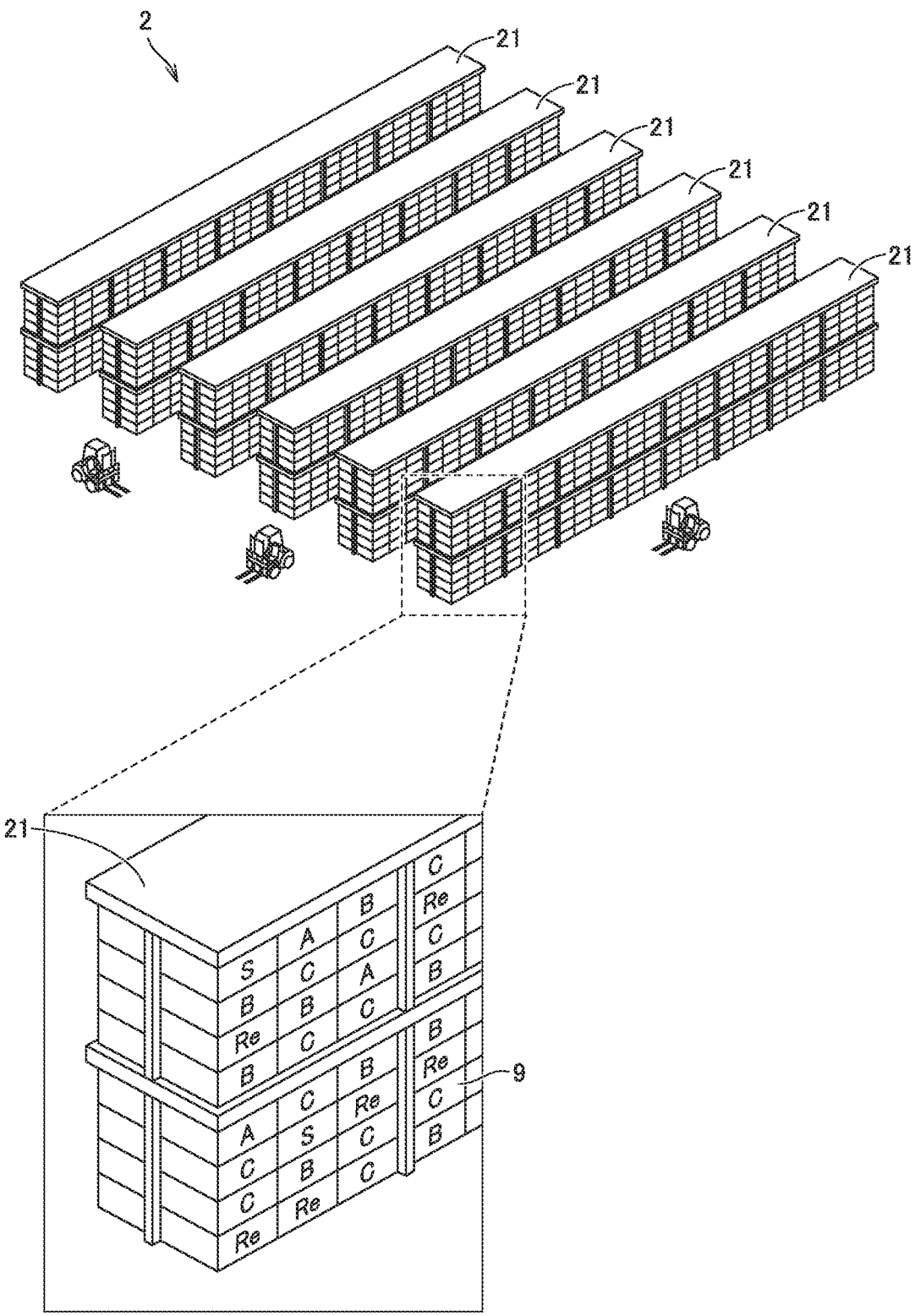
FIG. 2 is a diagram illustrating an example in which used batteries are stored in a storage cabinet.

FIG. 2 is a diagram illustrating an example in which the used batteries 9 are stored in the storage cabinet 21. As illustrated in FIG. 2, a plurality of storage cabinets 21 are arranged in a building of the battery cellar 2. Each of the plurality of storage cabinets 21 is configured to store a number of used batteries 9. Although the details will be described later, in the present embodiment, the battery cellar 2 performs a degradation evaluation test on each of the used batteries 9 stored in the storage cabinet 21. Then, based on the result of the degradation evaluation test, the battery cellar 2 determines whether each used battery 9 is recyclable or not (whether each used battery 9 is suitable for recycle or not).

Referring back to FIG. 1, the customer 3 purchases the used batteries 9 determined to be recyclable from the battery cellar 2. The customer 3 may include a vendor 31 who sells the used battery 9 as a vehicular battery, and a user 32 who uses the used battery 9 as a stationary battery in a factory, building, or the like. In addition, the customer 3 may include a vendor 33 who sells the used battery 9 as a service component (such as a maintenance or repair component).

The recycling plant 4 recycles materials of a used battery 9 which is determined to be unrecyclable by the battery cellar 2 as raw materials of another product.

The power system 5 is a power network constructed by a power plant, a power transmission and distribution facility, or the like. In the present embodiment, an electric power company serves as both a power generation company and a power transmission and distribution company. The electric power company function as a general electric power transmission and distribution operator and as an administrator who manages and maintains the power system 5. The power system 5 includes a company server 50. The company server 50 is owned by the electric power company, and is configured to manage the supply and demand of electric power of the power system 5. The server 20 and the company server 50 are configured to communicate with each other in both directions.

The DER 6 is a smaller electric power facility which is provided in a distribution center (or a peripheral area thereof) where the battery cellar 2 is arranged. The DER 6 is capable of transmitting electric power to or receiving electric power from the battery cellar 2. The DER 6 includes, for example, a power generation DER and a power storage DER.

The power generation DER may be a naturally fluctuating power source or a generator. The naturally fluctuating power source is such a power facility that the power output thereof fluctuates depending on weather conditions. Although FIG. 1 illustrates a solar power facility (a solar panel), the naturally fluctuating power source may be a wind power facility instead of or in addition to the solar power facility. On the other hand, the generator is a power facility independent of weather conditions. The generator may be a steam turbine generator, a gas turbine generator, a diesel engine generator, a gas engine generator, a biomass generator, a stationary fuel cell, or the like. The generator may be a cogeneration system that utilizes heat generated during the generation of electric power.

The storage DER may be a power storage system or a heat storage system. The power storage system is a stationary power storage device that stores electric power generated by the naturally fluctuating power source or the like. The power storage system may be a power-to-gas apparatus that uses the electrical power to produce gaseous fuels (such as hydrogen or methane). The heat storage system includes a heat storage tank provided between a heat source and a load and configured to temporarily store a liquid medium in the heat storage tank in a heated state. The heat storage system may be used to offset the heat generation and the heat consumption in time. Therefore, for example, heat generated by the heat source device by consuming the electric power during the nighttime may be stored in the heat storage tank, and the stored heat may be used to perform air conditioning during the daytime.

As described above, the used batteries 9 recovered by the recovery operator 1 are stored in the battery cellar 2 before they are shipped to the customer 3 or recycled in the recycling plant 4. Since maintenance cost (running cost) is required to appropriately store the used batteries 9 in the battery cellar 2, and the recovered used batteries 9 may be stored in the battery cellar 2 for a certain period before they are sold to the customer 3 or recycled in the recycling plant 4, it is desirable to effectively utilize the used batteries 9 stored in the battery cellar 2 during the storage period.

In the present embodiment, in addition to the storage of the used batteries 9, the battery cellar 2 functions as a virtual power plant (VPP). Thus, the charging/discharging of the used batteries 9 includes both the degradation evaluation of the used batteries 9 for determining the recycle mode of the used batteries 9 and the power supply and demand adjustment of the power system 5 using the used batteries 9. As a result, in the battery cellar 2, the storage of the used batteries 9, the degradation evaluation of the used batteries 9, and the power demand and demand adjustment using the used batteries 9 are performed in an integrated manner.

<Recycle of Battery>

Figure 3:
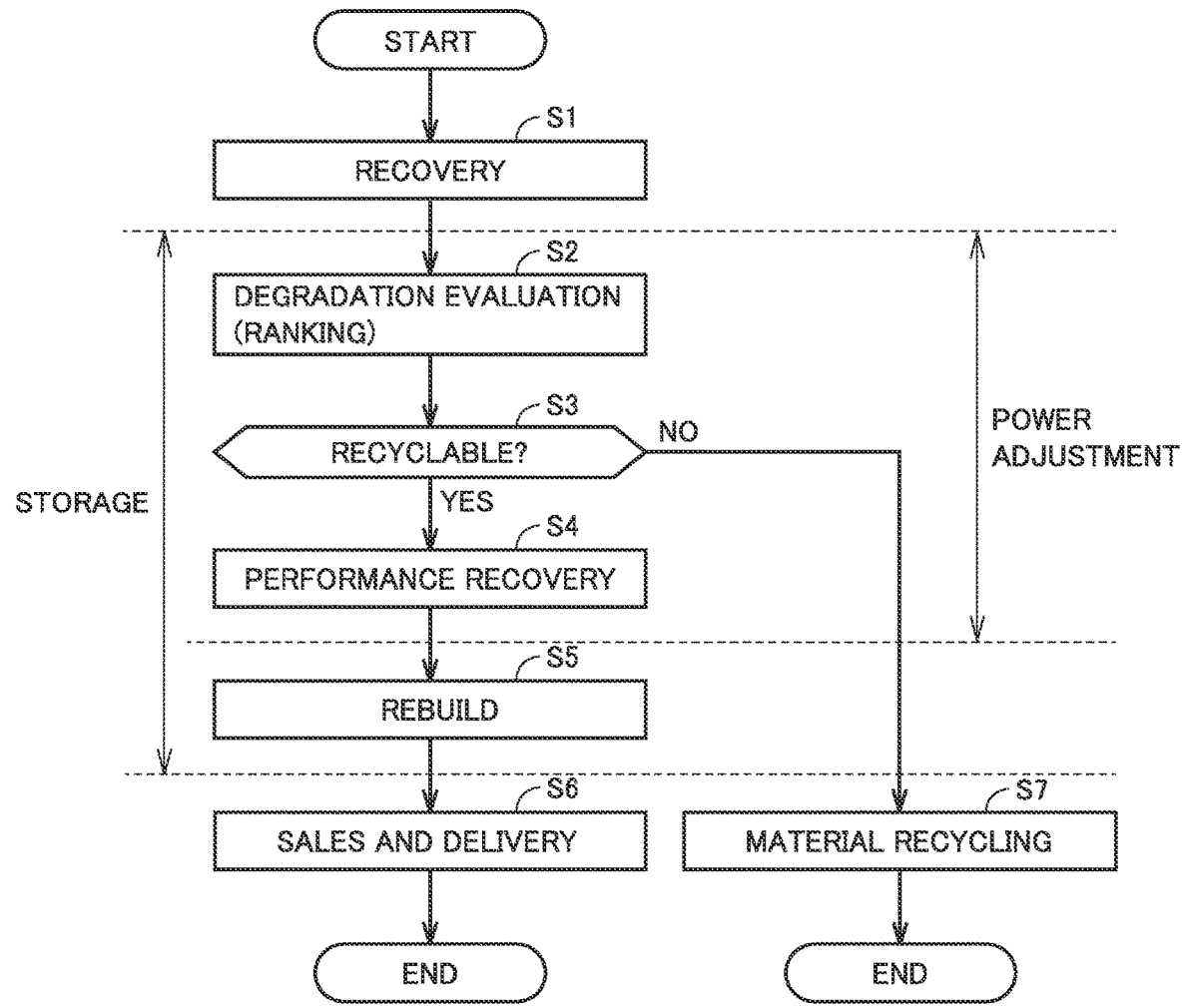
FIG. 3 is a flowchart schematically illustrating a process of recycling a used battery.

FIG. 3 is a flowchart schematically illustrating a process of recycling the used batteries 9. First, the used batteries 9 are recovered by the recovery operator 1 and delivered to the battery cellar 2 (S1).

In the present embodiment, the server 20 performs a degradation evaluation test (performance inspection) on each of the used batteries 9 stored in the storage cabinet 21 (S2). The server 20 evaluates the degradation degree of each used battery 9 based on electrical characteristics such as a full charge capacity and an internal resistance (such as an AC impedance). Then, the server 20 determines whether each used battery 9 is recyclable or not based on the result of the degradation evaluation test (S3).

In the present embodiment, the used batteries 9 are ranked based on the result of the degradation evaluation test (more specifically, the measurement result of the full charge capacity). For example, as illustrated in FIG. 2, the used batteries 9 that may be rebuilt are ranked in the descending order of the full charge capacity into four ranks: rank S, rank A, rank B, and rank C. Thus, the trade price of each used battery 9 may be determined in association with the rank thereof, and the quality of each used battery 9 may be guaranteed in association with the rank thereof. Therefore, the used batteries 9 may be smoothly distributed from the battery cellar 2 to the market. A used battery 9, the full charge capacity of which is less than a prescribed value, is ranked lower than rank C (represented as Re), and is transported to the material recycling.

If it is determined that the used battery 9 is recyclable (YES in S3), the procedure proceeds to the performance recovery step (S4). In the performance recovery step, a process (performance recovery process) is performed on the used battery 9 so as to recover the performance thereof. For example, the full charge capacity of a used battery 9 may be recovered by overcharge the used battery 9. However, the performance recovery step may be omitted. Based on the result of the degradation evaluation test, the performance recovery step may be performed on a used battery 9 which has a large degradation degree (the performance thereof is greatly reduced), whereas the performance recovery step may not be performed on a used battery 9 which has a small degradation degree (the performance thereof is not greatly reduced).

Subsequently, a new battery pack is manufactured (rebuilt) using the used batteries 9, the performance of which has been recovered in the performance recovery step (S5). The new battery pack is basically rebuilt from the used batteries 9, the performance of which has been recovered in the performance recovery step, and may include a used battery 9, the performance of which is not recovered in the performance recovery step, or a new battery (a new module). Thereafter, the battery pack is sold and shipped to the customer 3 (S6).

If it is determined that the used battery 9 is not recyclable based on the result of the degradation evaluation test (NO in S3), the used battery 9 is transported to the recycling plant 4 (S7). In the recycling plant 4, the used battery 9 is dismantled and materially recycled.

As described above, after the used batteries 9 are recovered by the recovery operator 1, the used batteries 9 are stored in the battery cellar 2 until they are shipped to the customer 3 or transported to the recycling plant 4, and during the storage period, the degradation evaluation test is performed on each used battery 9. In order to measure the electrical characteristics such as the full charge capacity of the used battery 9 in the degradation evaluation test, the used battery 9 is charged or discharged. In the present embodiment, the electric power exchanged between the battery cellar 2 (and the DER 6) and the power system 5 is used to charge or discharge the used battery 9. Thus, the battery cellar 2 functions as a VPP (or a DER) and contributes to the load leveling of the power system 5. More specifically, during a time period when the power system 5 has a power surplus as compared with the power demand, the battery cellar 2 uses the power surplus to charge the used batteries 9 so as to absorb the power surplus. On the other hand, during a time period when the power system 5 has a power shortage as compared with the power demand, the battery cellar 2 discharges the used batteries 9 so as to compensate the power shortage.

However, the battery cellar 2 may not be configured to absorb the power surplus and compensate the power shortage of the power system 5. The battery cellar 2 may be configured to absorb the power surplus only or to compensate the power shortage only. For example, the battery cellar 2 may be configured to charge the used battery 9 with the power surplus of the power system 5, and may be configured to discharge the electric power from the used batteries 9 to a power destination different from the power system 5. The battery cellar 2 may be configured to discharge the electric power from the used batteries 9 to, for example, the DER 6 only.

<Electrical Configuration of Battery Cellar>

Figure 4:
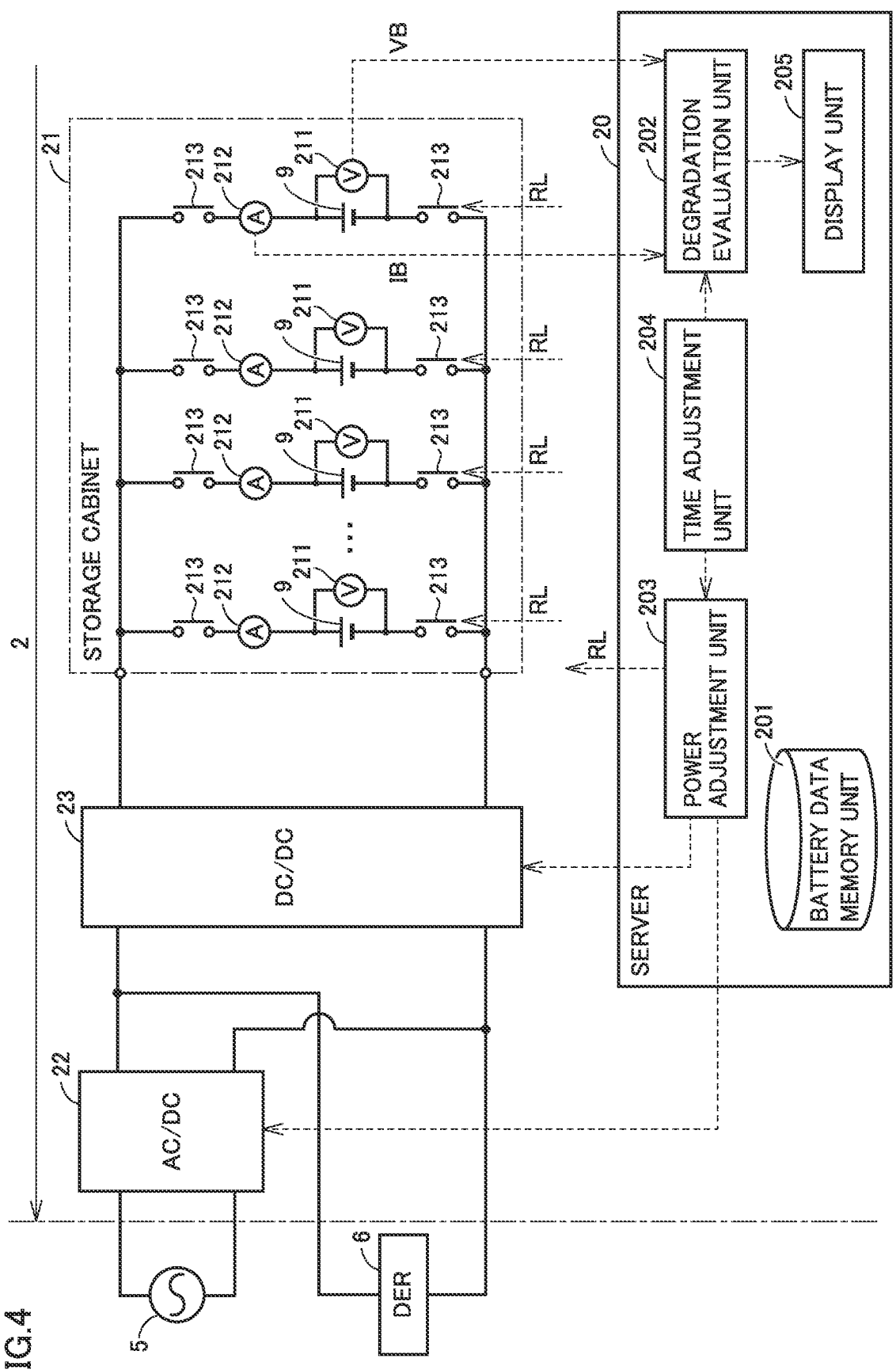
FIG. 4 is a diagram illustrating an electrical configuration of a battery cellar.

FIG. 4 is a diagram illustrating an electrical configuration of the battery cellar 2. The battery cellar 2 includes, for example, a storage cabinet 21, an AC/DC converter 22, a DC/DC converter 23, and a server 20. Although only one storage cabinet 21 is illustrated in FIG. 4 due to the limitation of paper space, a typical battery cellar 2 may include a plurality of storage cabinets 21 as illustrated in FIG. 2.

The storage cabinet 21 stores a plurality of used batteries 9. Although in FIG. 4 the plurality of used batteries 9 are connected in parallel to each other, it is merely an example, and the connection of the plurality of used batteries 9 is not particularly limited. For example, the plurality of used batteries 9 may be connected in series, or may be connected via a combination of serial connection and parallel connection. The storage cabinet 21 includes a voltage sensor 211, a current sensor 212, and a relay 213.

The voltage sensor 211 detects a voltage VB of the used battery 9, and outputs the detected voltage to the server 20. The current sensor 212 detects a current IB of the used battery 9, and outputs the detected current to the server 20. If the temperature is used in the degradation evaluation of the used battery 9, the storage cabinet 21 may further include a temperature sensor (not shown). Each sensor may be installed in each used battery 9.

The relay 213 includes, for example, a first relay electrically connected to a positive electrode of each used battery 9 and a second relay electrically connected to a negative electrode of each used battery 9. The relay 213 is configured to switch an electrical connection between each used battery 9 and the power system 5. Thus, an arbitrary used battery 9 may be electrically disconnected from the power system 5 during the charging/discharging of the other used batteries 9 so as to take the used battery 9 out of the storage cabinet 21.

The AC/DC converter 22 is electrically connected between the power system 5 and the DC/DC converter 23. The AC/DC converter 22 is configured to perform a bidirectional power conversion operation so as to charge or discharge the used battery 9 stored in the storage cabinet according to a control command (charging/discharging command) from the server 20. More specifically, the AC/DC converter 22 converts AC power supplied from the power system 5 into DC power, and charges the used battery 9 with the DC power. The AC/DC converter 22 converts DC power discharged from the used battery 9 into AC power, and supplies the AC power to the power system 5.

The DC/DC converter 23 is electrically connected between the AC/DC converter 22 and the storage cabinet 21, and is also electrically connected between the DER 6 and the storage cabinet 21. Similar to the AC/DC converter 22, the DC/DC converter 23 is configured to perform a bidirectional power conversion operation according to a control command (charging/discharging command) from the server 20. The DC/DC converter 23 may charge the used battery 9 with the DC power supplied from the AC/DC converter 22 and/or the DER 6, and may discharge the DC power stored in the used battery 9 to the AC/DC converter 22 and/or the DER 6. The AC/DC converter 22 and the DC/DC converter 23 correspond to the "power converter" according to the present disclosure.

The server 20 includes a processor such as a CPU (Central Processing Unit), a memory such as a ROM (Read Only Memory) and a RAM (Random Access Memory), and input/output ports (none of which is shown) through which various signals are input/output. The server 20 performs various controls based on signals received from the sensors as well as programs and maps stored in the memory. The server 20 includes a battery data memory unit 201, a degradation evaluation unit 202, a power adjustment unit 203, a time adjustment unit 204, and a display unit 205.

The battery data memory unit 201 stores battery data to be used for managing the used batteries 9 in the battery cellar 2.

FIG. 5 is a diagram illustrating an example data structure of a used battery 9. The battery data is stored in the format of a map, for example. The battery data includes, as parameters, for example, identification information (battery ID) for identifying the used battery 9, a model number of the used battery 9, a production date, a current SOC (State Of Charge), a full charge capacity, an internal resistance, a rank, a degradation evaluation time (the latest time at which the degradation evaluation test is performed), a storage position (identification information of a storage cabinet in which the used battery 9 is stored), and replacement required or not (presence of a replacement-required battery). The battery data may include other parameters than those mentioned above, such as an index $\Sigma D$ indicating the deviation of salt concentration distribution in the electrolytic solution of the used battery 9.

Referring again to FIG. 4, the degradation evaluation unit 202 performs a degradation evaluation test on each used battery 9 based on the voltage VB detected by the voltage sensor 211 and the current IB detected by the current sensor 212 during the charging/discharging of the used battery 9. An example evaluation method will be described with reference to FIG. 10. The degradation evaluation unit 202 ranks the used battery 9 based on the result of the degradation evaluation test.

The power adjustment unit 203 adjusts the electric power exchanged between the battery cellar 2 (and the DER 6) and the power system 5. More specifically, the server 20 selects a used battery 9 to be charged or discharged from the plurality of used batteries 9 according to a demand response (DR) request from the company server 50 (see FIG. 1). In order to charge or discharge the selected used battery 9, the power adjustment unit 203 sends a command to the relay 213, the AC/DC converter 22 and the DC/DC converter 23. An example control method will be described with reference to FIG. 11.

The time adjustment unit 204 adjusts a time at which the degradation evaluation unit 202 performs a degradation evaluation test on a used battery 9 and a time at which the power adjustment unit 203 adjusts the electric power exchanged between the battery cellar 2 and the power system 5. More specifically, the time adjustment unit 204 performs the time adjustment so that the degradation evaluation test of the used battery 9 is performed at a time in synchronization with the time at which the used battery 9 in the battery cellar 2 is charged or discharged in response to the DR request from the company server 50. In addition to the degradation evaluation test, the performance recovery process (see S4 in FIG. 3) may be performed at a time in synchronization with the time at which the used battery 9 in the battery cellar 2 is charged or discharged in response to the DR request from the company server 50.

The display unit 205 displays the battery data (see FIG. 5) in response to an instruction from an administrator of the battery cellar 2 (or an employee of the battery cellar 2). The display unit 205 also displays the progress and results of the degradation evaluation test performed by the degradation evaluation unit 202. Thus, the administrator may understand the progress and results of the degradation evaluation test. Further, the display unit 205 displays the charging/discharging conditions of the used battery 9 selected by the power adjustment unit 203. Thus, the administrator may understand the result of the power adjustment between the battery cellar 2 and the power system 5.

<Replacement of Used Battery>

In the case of new batteries, the performance thereof may be substantially uniformly managed, whereas in the case of used batteries, the performance (degradation degree) thereof varies greatly. When the battery cellar 2 functions as a VPP, the used battery 9 degrades along with the charging/discharging thereof. Therefore, regarding the plurality of used batteries stored in the storage cabinet 21 of the battery cellar 2, it is desirable to replace a part of the used batteries 9 that have degraded to a certain extent (such as the used batteries 9 that have degraded to the extent of material recycling) with other used batteries that do not degrade to such extent. However, the replacement of the used batteries 9 requires labor and cost.

Thus, in the present embodiment, at the time of replacing a part of the degraded used batteries 9, the used batteries which do not excessively degrade at this time but are predicted to excessively degrade in the near future are also replaced. In order to facilitate understanding of the replacement of a used battery according to the present embodiment, first, the replacement of a used battery according to a comparative example will be described.

Figure 6:
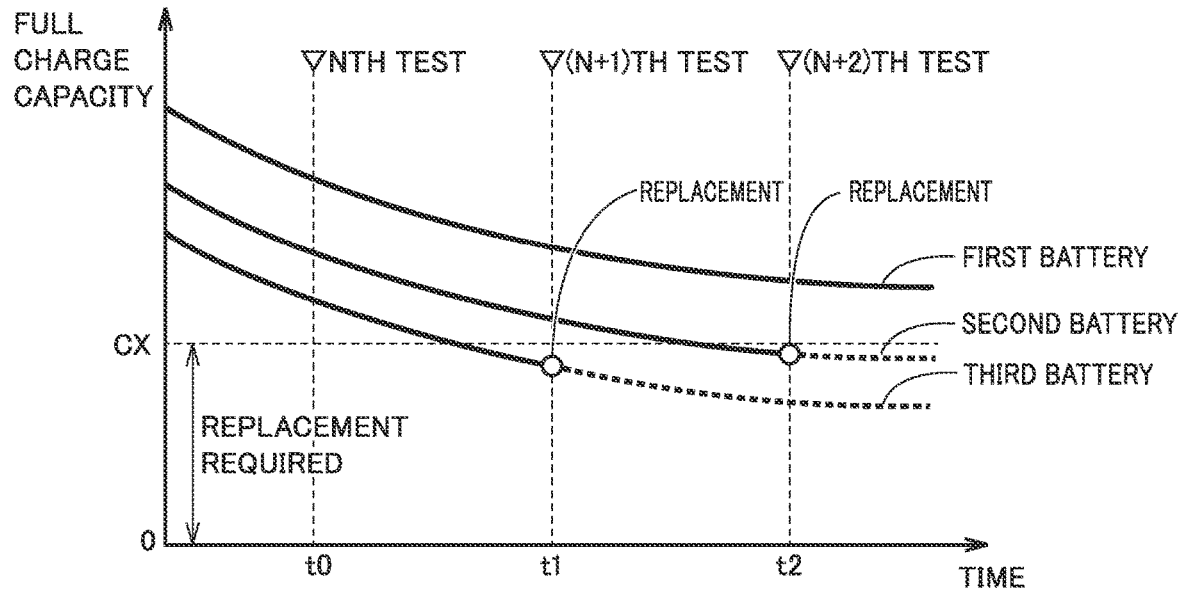
FIG. 6 is a diagram illustrating how to replace a used battery according to a comparative example.
Figure 7:
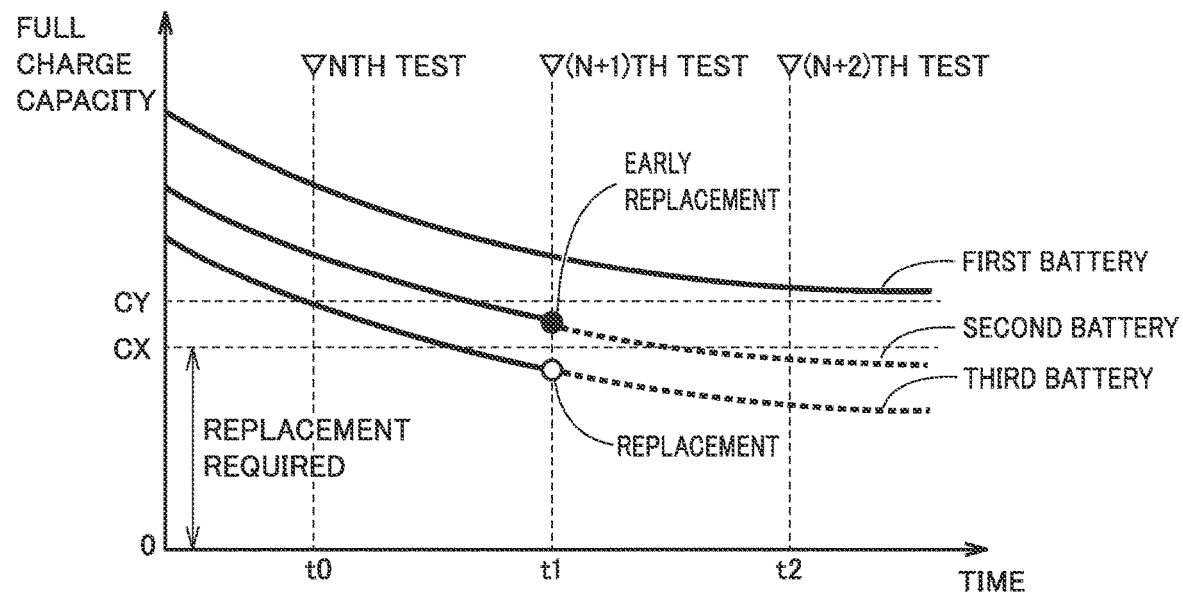
FIG. 7 is a diagram illustrating how to replace a used battery according to the present embodiment.

FIG. 6 is a diagram illustrating how to replace a used battery 9 according to the comparative example. In FIGS. 6 and 7, the horizontal axis represents elapsed time, and the vertical axis represents the full charge capacity of each used battery 9. In the example, for the sake of simplification, the description will be carried out with an example where the number of used batteries 9 stored in the battery cellar 2 is three. The three used batteries 9 are referred to as a first battery, a second battery, and a third battery. The degradation degree of each battery decreases in the order of the first battery, the second battery and the third battery (the full charge capacity of each battery increases in the same order).

In the comparative example, a degradation evaluation test is periodically performed on the first battery, the second battery and the third battery. A reference value CX is set for comparison with the full charge capacity of each of the first battery, the second battery and the third battery. In the first battery, the second battery and the third battery, if the full charge capacity of a used battery 9 is smaller than the reference value CX, this used battery is determined to be a used battery that requires replacement. Hereinafter, a battery that requires replacement is also referred to as a "replacement-required battery". The replacement-required battery corresponds to the "replacement target battery" in the present disclosure.

As illustrated in FIG. 6, in the Nth (N is a positive integer) degradation evaluation test, the full charge capacity of each of the first battery, the second battery and the third battery is greater than the reference value CX. Therefore, it is determined that no battery is required to be replaced. In the subsequent (N+1)th degradation evaluation test, the full charge capacity of each of the first battery and the second battery is greater than the reference value CX, while the full charge capacity of the third battery is smaller than the reference value CX. Therefore, it is determined that the third battery is required to be replaced. In the (N+2)th degradation evaluation test, the full charge capacity of the first battery is greater than the reference value CX, while the full charge capacity of the second battery is smaller than the reference value CX. Therefore, it is determined that the second battery is required to be replaced. Thus, in the comparative example, the third battery is replaced after the (N+1)th degradation evaluation test, and the second battery is replaced after the (N+2)th degradation evaluation test. In other words, the used batteries 9 are replaced twice.

FIG. 7 is a diagram illustrating how to replace a used battery 9 according to the present embodiment. In the present embodiment, in addition to the reference value CX, a reference value CY greater than the reference value CX is set for comparison with the full charge capacity of each of the first battery, the second battery and the third battery. The reference value CY may be set greater than the reference value CX by, for example, a decrement in the full charge capacity that may occur between two of the consecutive degradation evaluation tests. Thus, if the full charge capacity falls between the reference value CX and the reference value CY according to the result of a degradation evaluation test performed at a given time, it is possible to predict that the full charge capacity will become smaller than the reference value CX in the next degradation evaluation test.

As illustrated in FIG. 7, in the Nth (N is a positive integer) degradation evaluation test, the full charge capacity of each of the first battery and the second battery is greater than the reference value CY, and the full charge capacity of the third battery is greater than the reference value CX but smaller than the reference value CY. Since there is no such a used battery that the full charge capacity thereof is smaller than the reference value CX, it is determined that there is no replacement-required battery.

In the (N+1)th degradation evaluation test, the full charge capacity of the first battery is greater than the reference value CY, the full charge capacity of the second battery is greater than the reference value CX but smaller than the reference value CY, and the full charge capacity of the third battery is smaller than the reference value CX. In this case, the third battery is determined to be a replacement-required battery as in the comparative example. In addition, according to the present embodiment, the second battery is also determined to be a replacement-required battery. This is because, since the full charge capacity of the second battery is greater than the reference value CX but smaller than the reference value CY, it is predicted that the full charge capacity of the second battery will become smaller than the reference value CX in the near future (for example, in the next degradation evaluation test).

In the (N+2)th degradation evaluation test, the full charge capacity of the first battery is greater than the reference value CX (also greater than the reference value CY in the present embodiment). Therefore, it is determined that there is no replacement-required battery.

As described above, in the comparative example, since the second battery and the third battery are replaced separately, the used batteries 9 are replaced twice in total. On the other hand, in the present embodiment, the second battery is also replaced at the time of replacing the third battery (early replacement). Thus, the used batteries 9 are replaced once, which makes it possible to reduce the number of times of replacing the used batteries 9 as compared with the comparative example. Therefore, it is possible to reduce labor and cost for replacing the used batteries.

<Flow of Replacing Use Battery>

Figure 8:
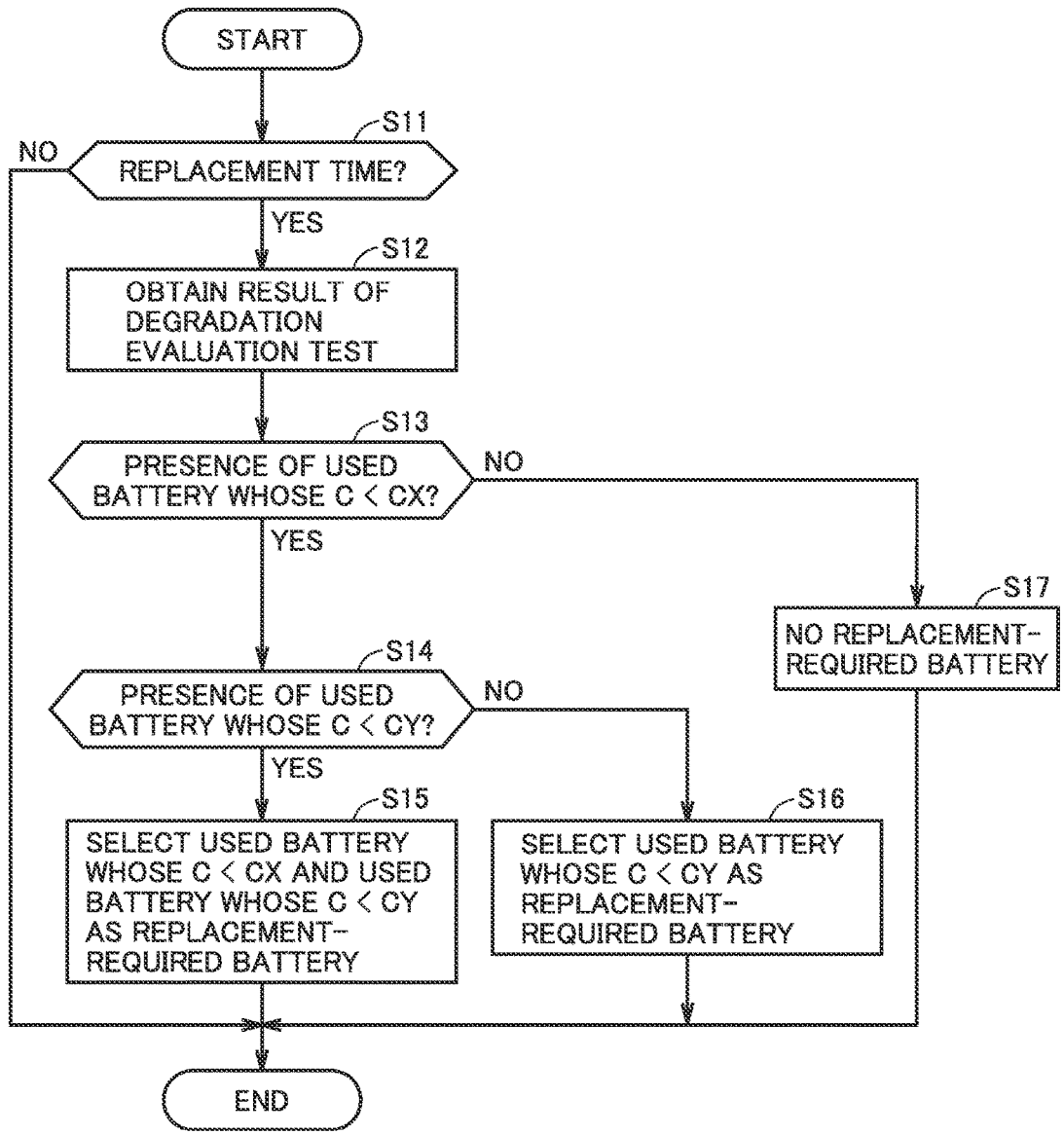
FIG. 8 is a flowchart illustrating a first example of a process of replacing a used battery according to the present embodiment.

FIG. 8 is a flowchart illustrating a first example of a process of replacing a used battery 9 according to the present embodiment. This flowchart (and other flowcharts to be described later) is invoked from a main routine (not shown) and executed when a predetermined condition is satisfied. Each step is implemented by software installed the server 20, but it may be implemented by hardware (electrical circuits) arranged in the server 20. Hereinafter, the term of "step" is abbreviated as S.

In S11, the server 20 determines whether or not a predetermined time for replacing a used battery 9 has arrived. The frequency for replacing a used battery 9 may be, for example, once a day, once a week, or once a month. If the time for replacing a used battery 9 has not arrived (NO in S11), the subsequent steps are skipped, and the procedure returns to the main routine.

If the time for replacing a used battery 9 has arrived (YES in S11), the server 20 obtains the result of the degradation evaluation test (the full charge capacity C) performed in another flow for each of the plurality of used batteries 9 stored in the battery cellar 2 (S12). As an example, the server 20 may read the full charge capacity C from the battery data stored in the battery data memory unit 201.

In S13, the server 20 determines whether or not a used battery 9, the full charge capacity C of which is less than the reference value CX, is present in the plurality of used batteries 9 stored in the battery cellar 2. If there is no such a used battery 9, the full charge capacity C of which is less than the reference value CX (NO in S13), the server 20 determines that there is no replacement-required battery (S17).

If there is an used battery 9, the full charge capacity C of which is less than the reference value CX (YES in S13), the server 20 further determines whether or not there is an used battery 9, the full charge capacity C of which is less than the reference value CY, in addition to the used battery 9, the full charge capacity C of which is less than the reference value CX (S14). If there is no used battery 9, the full charge capacity C of which is less than the reference value CY, except the used battery 9, the full charge capacity C of which is less than the reference value CX (NO in S14), the server 20 selects only the used battery 9, the full charge capacity C of which is less than the reference value CX as the replacement-required battery (S16).

On the other hand, if there is a used battery 9, the full charge capacity C of which is less than the reference value CY (YES in S14), in other words, if there are both the used battery 9, the full charge capacity C of which is less than the reference value CX, and the used battery 9, the full charge capacity C of which is greater than or equal to the reference value CX but less than the reference value CY, the server 20 selects both of the used batteries 9 as the replacement-required batteries (S15). after the process of S15 to S17 ends, the server 20 returns the procedure to the main routine.

FIGS. 6 to 8 illustrate an example in which the degradation degree of the used battery 9 is evaluated based on the full charge capacity. However, the degradation degree of the used battery 9 may be evaluated based on another index such as the internal resistance.

In the actual administration of the battery cellar 2, there is an upper limit for the number of used batteries 9 to be replaced at one time. The upper limit may be determined based on, for example, the number of operators who replace the used battery 9 or the length of work time. When the number of used batteries 9 to be replaced is greater than the upper limit, it is required to determine which used battery 9 is to be selected as the replacement-required battery.

Figure 9:
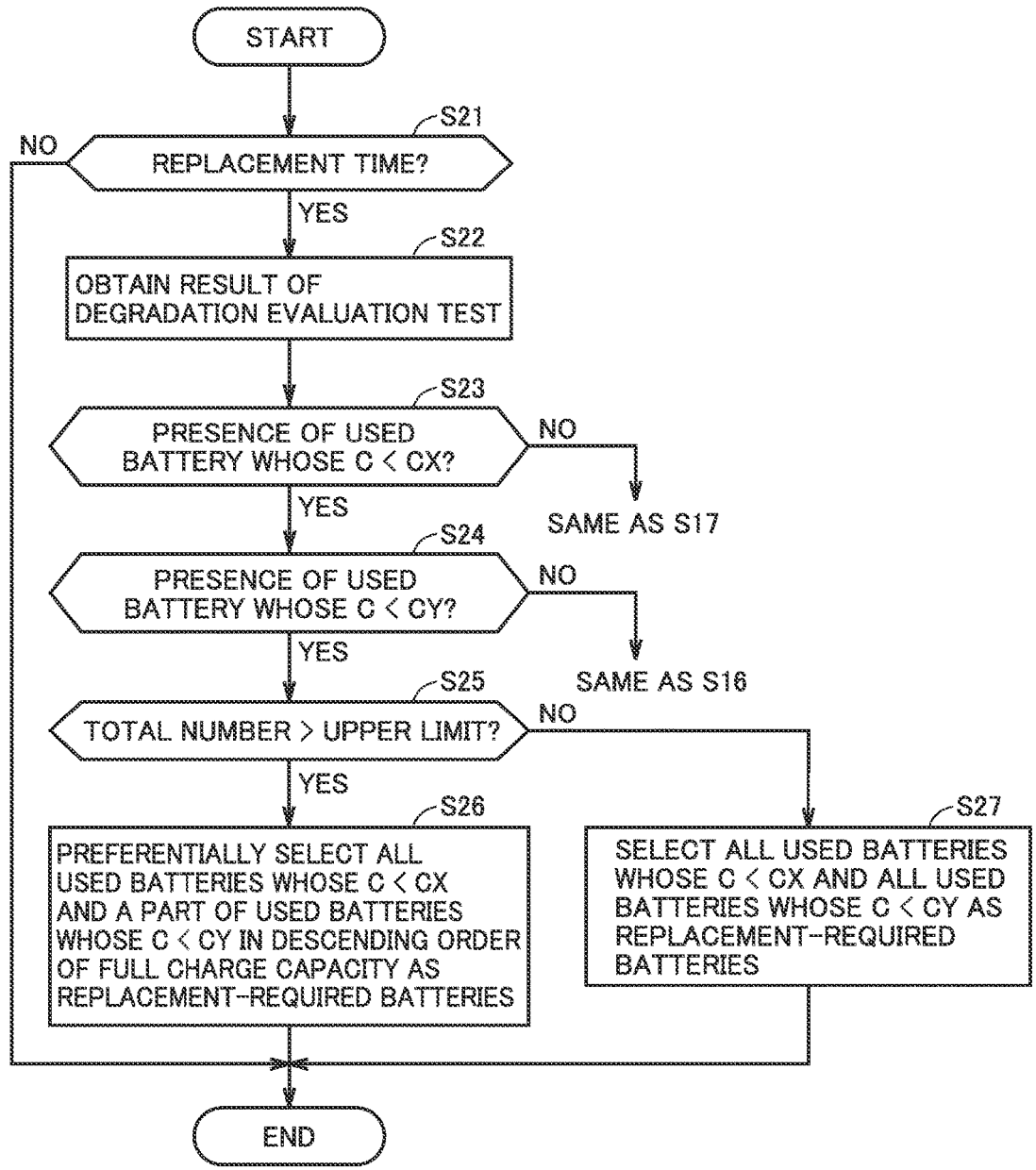
FIG. 9 is a flowchart illustrating a second example of a process of replacing a used battery according to the present embodiment.

FIG. 9 is a flowchart illustrating a second example of a process of replacing a used battery 9 according to the present embodiment. Since the processes of S21 to S24 are the same as the processes of S11 to S14 of the flowchart illustrated in FIG. 8, and the process when the determination result in S23 is NO and the process when the determination result in S24 is NO are the same as the process in S17 and the process in S16 of the flowchart, the detailed description thereof will not be repeated.

When there are both the used battery 9, the full charge capacity C of which is less than the reference value CX, and the used battery 9, the full charge capacity C of which is greater than or equal to the reference value CX but less than the reference value CY (YES in S24), the server 20 advances the procedure to S25.

In S25, the server 20 determines whether or not the total number of the used batteries 9 satisfying the condition where the determination result is YES in S23 and S24, in other words, the total number of the used batteries 9, the full charge capacity C of which is less than the reference value CX, and the used batteries 9, the full charge capacity C of which is greater than or equal to the reference value CX but less than the reference value CY, is greater than the upper limit. If it is determined that the total number is equal to or less than the upper limit (NO in S25), the server 20 selects all the used batteries 9, the full charge capacity C of which is less than the reference value CX and all the used batteries 9, the full charge capacity C of which is equal to or greater than the reference value CX but less than the reference value CY as the replacement-required batteries (S27).

On the other hand, if the total number is greater than the upper limit (YES in S25), the server 20 selects all the used batteries 9, the full charge capacity C of which is less than the reference value CX as the replacement-required batteries, and selects the used batteries 9, the full charge capacity C of which is equal to or greater than the reference value CX but less than the reference value CY as the replacement-required batteries as long as the number of the used batteries to be replaced is not greater than the upper limit (S26). More specifically, as the full charge capacity of a used battery 9 is smaller, the server 20 increases the priority order of selecting the used battery 9 as a replacement-required battery. For example, the server 20 may select the number of used batteries 9 without exceeding the upper limit from the used batteries 9 arranged in ascending order of full charge capacity.

By preferentially replacing the used battery 9 having a smaller full charge capacity, the recovery amount of the full charge capacity of the used battery (i.e., the difference between the full charge capacity after the replacement and the full charge capacity before the replacement) is increased. Thus, when the battery cellar 2 functions as a VPP, the amount of electric power that the battery cellar 2 can charge or discharge increases, which makes it possible to increase the payment obtained from the electric power company. Thereby, it is possible to increase the financial benefits of the battery cellar 2.

<Degradation Evaluation>

Figure 10:
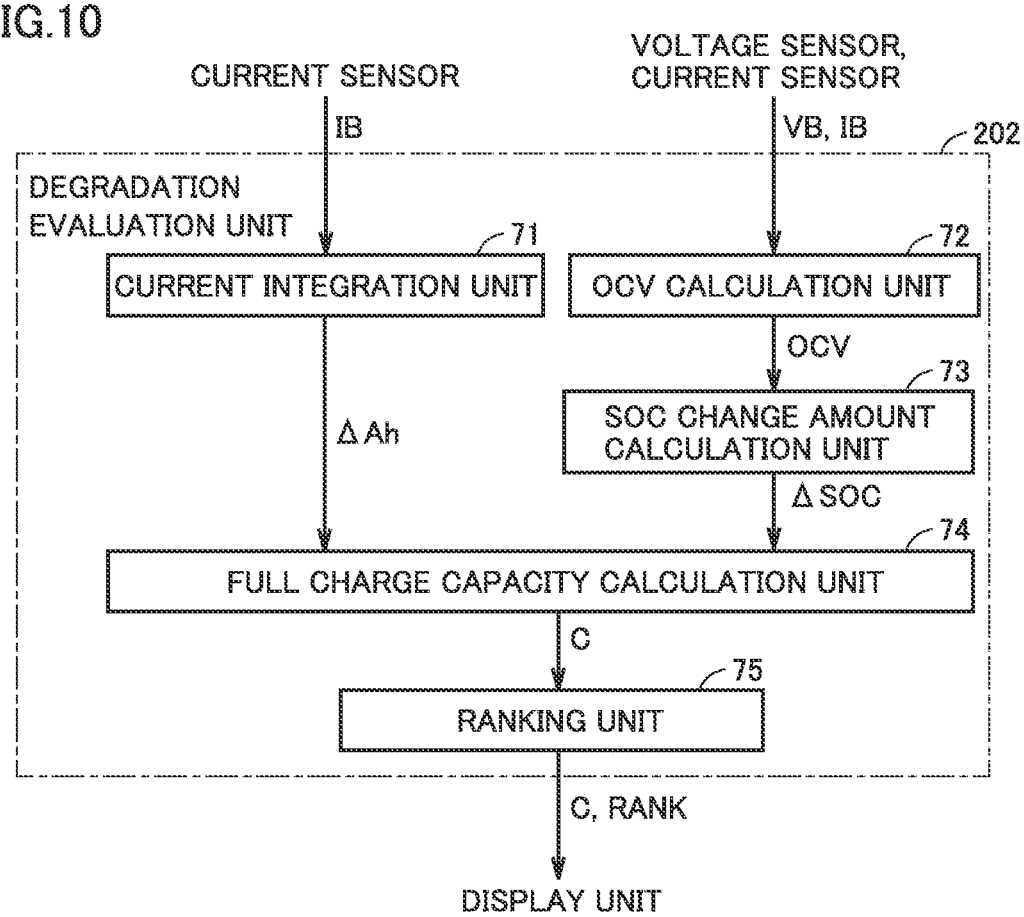
FIG. 10 is a functional block diagram illustrating a server which evaluates the degradation of a used battery.

FIG. 10 is a functional block diagram illustrating the server 20 (the degradation evaluation unit 202) which evaluates the degradation of the used batteries 9. Hereinafter, for the purpose of simplification, the description will be carried out on a single used battery 9. In fact, when a plurality of used batteries 9 are waiting for the degradation evaluation, the degradation evaluation may be performed simultaneously on the plurality of used batteries 9. The degradation evaluation unit 202 includes a current integration unit 71, an open circuit voltage (OCV) calculation unit 72, an SOC change amount calculation unit 73, a full charge capacity calculation unit 74, and a ranking unit 75.

The current integration unit 71, based on the current IB detected by the current sensor 212, calculates an integrated value (integrated current) $\Delta Ah$ (unit: Ah) of a current charged to or discharged from the used battery 9 during a period from a time when the start condition of current integration is satisfied to a time when the end condition of current integration is satisfied. As described above in the present embodiment, the charging/discharging of the used battery 9 is performed in response to the DR request from the company server 50, and the current flowing through the used battery 9 is integrated during the charging/discharging. More specifically, in the case of an increase DR request (power increase request), the used battery 9 is charged so as to increase the power demand of the battery cellar 2, and the charge current is integrated during the charging. On the other hand, in the case of a decrease DR request (power decrease request), the used battery 9 is discharged so as to reduce the power demand of the battery cellar 2, and the discharge current is integrated during the discharging. The current integration unit 71 outputs the integrated current $\Delta Ah$ to the full charge capacity calculation unit 74.

The OCV calculation unit 72 calculates an OCV of the used battery 9 at the start of current integration and an OCV of the used battery 9 at the end of current integration. The OCV may be calculated according to the following expression (1), for example.

$$OCV = VB - \Delta Vp - IB \times R \quad (1)$$

In the expression (1), R represents an internal resistance of the used battery 9, and Vp represents a polarization voltage. At the start of current integration (immediately before the start of charging/discharging), the current IB=0. Further, before the start of current integration when the used battery 9 is not charged or discharged, the polarization voltage Vp≅0. Therefore, the OCV at the start of current integration may be calculated based on the voltage VB detected by the voltage sensor 211. The internal resistance R may be determined according to the relationship between the voltage VB and the current IB (the Ohm's law). When the charging/discharging of the used battery 9 is performed at a constant current, since the relationship between the current IB and the polarization voltage Vp may be measured in advance, the polarization voltage Vp may be determined from the current IB detected by the current sensor 212. Therefore, the OCV of the used battery 9 at the end of current integration may be calculated based on the voltage VB and the current IB. The OCV calculation unit 72 outputs the two calculated OCVs, i.e., the calculated OCV of the used battery 9 at the start of current integration and the calculated OCV of the used battery 9 at the end of current integration, to the SOC change amount calculation unit 73.

The SOC change amount calculation unit 73 calculates the SOC change amount $\Delta SOC$ of the used battery 9 from the start of current integration to the end of current integration based on the two calculated OCVs. A characteristic curve (OCV-SOC curve) indicating a relationship between the OCV and the SOC is preliminarily stored in the SOC change amount calculation unit 73. Thus, the SOC change amount calculation unit 73 reads an SOC corresponding to the OCV at the start of current integration and an SOC corresponding to the OCV at the end of current integration by referring to the OCV-SOC curve, and calculates the difference between the two SOCs as $\Delta SOC$. The SOC change amount calculation unit 73 outputs the calculated $\Delta SOC$ to the full charge capacity calculation unit 74.

The full charge capacity calculation unit 74 calculates a full charge capacity C of the used battery 9 based on the $\Delta Ah$ obtained from the current integration unit 71 and the $\Delta SOC$ obtained from the SOC change amount calculation unit 73. More specifically, the full charge capacity C of the used battery 9 may be calculated according to the following expression (2). Since an initial full charge capacity C0 may be obtained from the specifications of the used battery 9, the full charge capacity calculation unit 74 may calculate a capacity retention rate Q from the full charge capacity C and the initial full charge capacity C0 (Q=C/C0). The full charge capacity calculation unit 74 outputs the calculated full charge capacity C to the ranking unit 75.

$$C = \Delta Ah / \Delta SOC \times 100 \quad (2)$$

The ranking unit 75 ranks each used battery 9 according to the full charge capacity C. The ranking unit 75 may record the time where each used battery 9 is ranked as the degradation evaluation time in the battery data (see FIG. 5).

The rank of the used battery 9 is displayed on the display unit 205 together with the battery ID, the storage position of the used battery 9 and the like. As a result, when a request to purchase the used battery 9 is received from the customer 3, an employee of the battery cellar 2 may take out the used battery 9 having a rank corresponding to the request of the customer 3 from the storage position. By appropriately taking out the used batteries that have been sold from the storage cabinet 21, it is possible to keep a free space in the storage cabinet 21.

The method of calculating the full charge capacity C is merely an example. Any method may be employed to calculate the full charge capacity C as long as the method uses the voltage VB and the current IB detected during the charging/discharging of the used battery 9. Instead of or in addition to the full charge capacity C, the ranking unit 75 may rank a used battery 9 based on another characteristics (such as the internal resistance R of a used battery 9 or the index $\Sigma D$ indicating the deviation of the electrolytic solution concentration in a lithium ion battery). The ranking unit 75 may rank a used battery 9 based on the length of time during which the used battery 9 is charged or discharged and/or the number of times the used battery 9 is charged or discharged. The ranking unit 75 may rank a used battery 9 based on the elapsed time from the production of the used battery 9, although the determined rank may not be sufficiently accurate. The ranking unit 75 may rank a used battery 9 based on a combination of the factors mentioned above (such as the full charge capacity C, the internal resistance R, the index ΣD, the charging/discharging time, the number of charging/discharging times, the elapsed time from the production).

<Power Adjustment>

Figure 11:
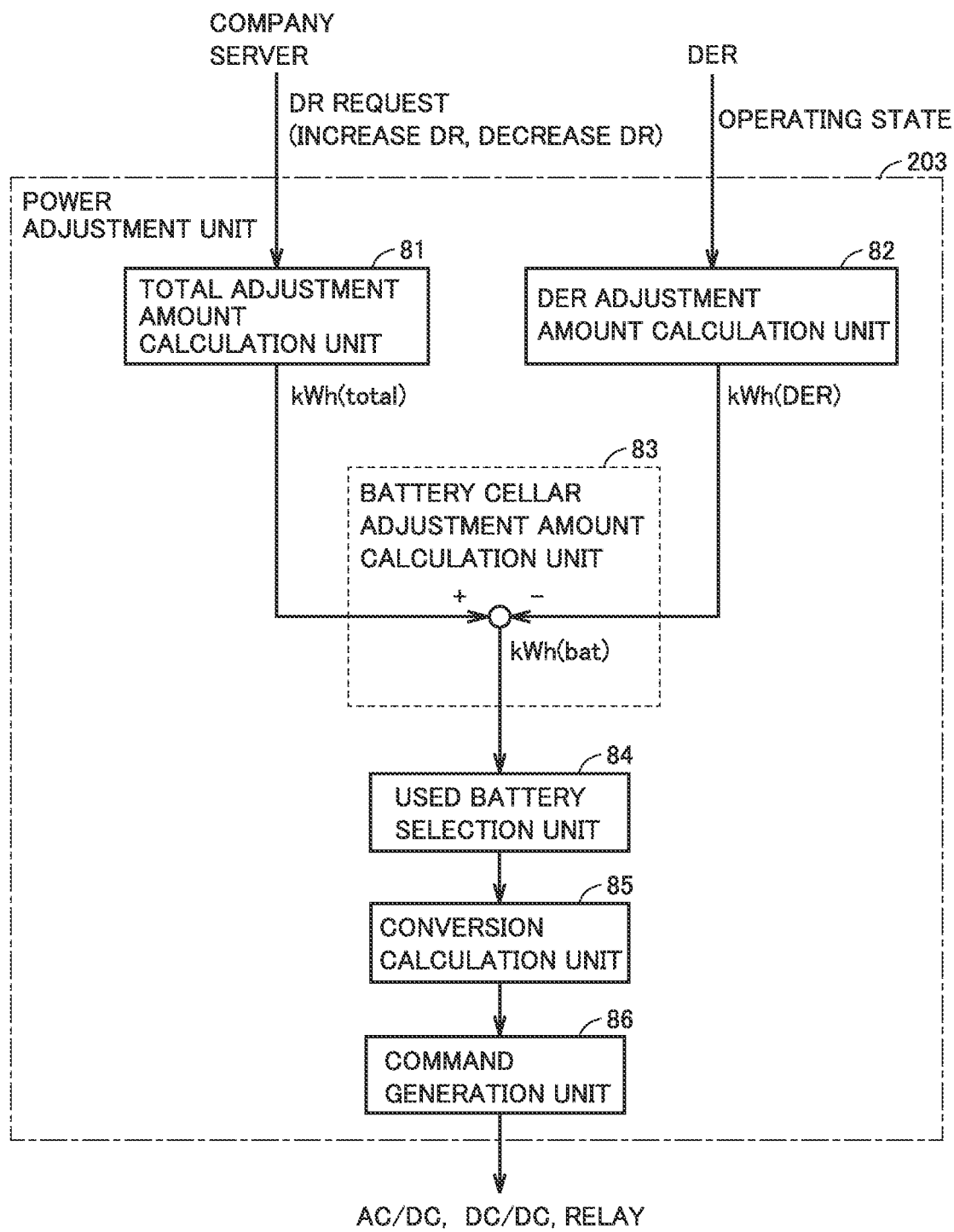
FIG. 11 is a functional block diagram illustrating a server which adjusts the electric power exchanged between a battery cellar and a power system.

FIG. 11 is a functional block diagram illustrating the server 20 (the power adjustment unit 203) which adjusts the electric power exchanged between the battery cellar 2 and the power system 5. In the present embodiment, for the purpose of easy understanding, the description is carried out on the assumption that the DER 6 is a power generation DER (in particular, a naturally fluctuating power source such as a solar power facility). The power adjustment unit 203 includes a total adjustment amount calculation unit 81, a DER adjustment amount calculation unit 82, a battery cellar adjustment amount calculation unit 83, a used battery selection unit 84, a conversion calculation unit 85, and a command generation unit 86.

Upon receipt of a DR request from the company server 50, the total adjustment amount calculation unit 81 calculates a total amount of electric power that is required by the battery cellar 2 and the DER 6 to perform the power adjustment during a predetermined period (for example, 30 minutes). This amount of electric power is hereinafter referred to as the total adjustment amount, and is denoted as kWh (total). The total adjustment amount calculation unit 81 outputs the calculated kWh (total) to the battery cellar adjustment amount calculation unit 83.

The DER adjustment amount calculation unit 82 acquires the operating state of each DER 6 (more specifically, the expected amount of electric power generated by each DER 6 during a predetermined period) through the communication with the DER 6. This amount of electric power is hereinafter referred to as the DER adjustment amount, and is denoted as kWh (DER). The DER adjustment amount calculation unit 82 outputs the acquired kWh (DER) to the battery cellar adjustment amount calculation unit 83.

Based on the kWh (total) obtained from the total adjustment amount calculation unit 81 and the kWh (DER) obtained from the DER adjustment amount calculation unit 82, the battery cellar adjustment amount calculation unit 83 calculates the amount of electric power required by the battery cellar 2 to perform the power adjustment. This amount of electric power is hereinafter referred to as the battery cellar adjustment amount, and is denoted as kWh (bat). The battery cellar adjustment amount calculation unit 83 calculates the difference between the two amounts of power, i.e., ΔkWh=kWh (total)−kWh (DER), as the battery cellar adjustment amount kWh (bat). The battery cellar adjustment amount calculation unit 83 outputs the calculated kWh (bat) to the used battery selection unit 84.

The used battery selection unit 84 obtains an amount of electric power that may be charged to or discharged from each of the plurality of the used batteries 9 stored in the plurality of storage cabinets 21 (see the battery data in FIG. 5). The used battery selection unit 84 selects a used battery from the plurality of the used batteries 9 to perform the power adjustment based on the kWh (bat) obtained from the battery cellar adjustment amount calculation unit 83. When kWh (bat)>0, the power shortage of the power system 5 is compensated by the electric power discharged from the used batteries in the battery cellar 2. Therefore, the used battery selection unit 84 selects a number of used batteries 9 capable of discharge an amount of electric power equal to or greater than the kWh (bat). On the other hand, when kWh (bat)<0, the power surplus of the power system 5 is absorbed by charging the used batteries in the battery cellar 2. Therefore, the used battery selection unit 84 selects a number of used batteries 9 that may be charged with an amount of electric power equal to or greater than the kWh (bat) (absolute value). The used batteries 9 may be selected in such a manner that the used batteries 9 with a lower demand rank will be preferentially charged or discharged, whereas the used battery 9 with a higher demand rank will not be charged or discharged as much as possible. The details of the process have been described in detail with reference to FIGS. 8 to 10, and therefore, the description thereof will not be repeated. The used battery selection unit 84 outputs the selected used batteries 9 and the amount of electric power assigned to each of the selected used batteries 9 (the amount of electric power that may be adjusted by each used battery 9) to the conversion calculation unit 85.

The conversion calculation unit 85 calculates the electric power to be charged to or discharged from each used battery 9 selected by the used battery selection unit 84. More specifically, the conversion calculation unit 85, based on the remaining time of the power adjustment, converts the amount of electric power (unit: kWh) which may be adjusted by using the used battery 9 into the electric power (unit: kW) for each used battery 9. For example, if the power adjustment amount assigned to a used battery 9 is 10 kWh, and the remaining time of the power adjustment is 15 minutes (0.25 h), the electric power may be calculated as 40 kW (=10 kWh/0.25 h). The conversion calculation unit 85 outputs the electric power to be charged to or discharged from each used battery 9 to the command generation unit 86.

The command generation unit 86, based on the calculation result obtained from the conversion calculation unit 85, generates a charging/discharging command to the AC/DC converter 22 and the DC/DC converter 23, and generates an open/close command to the relay 213. More specifically, the command generation unit 86 generates an open/close command so as to electrically connect the selected used batteries 9 to the DC/DC converter 23 or electrically disconnect the unselected used batteries 9 from the DC/DC converter 23. The command generation unit 86 generates the charging/discharging command so as to charge a total amount of electric power to the selected used batteries 9 or discharge the total amount of electric power from the selected used batteries 9.

Note that the power adjustment method illustrated in FIG. 11 is merely an example. In the present embodiment, it is assumed that the DER 6 is a power generation DER, and specifically a naturally fluctuating power source, the power output of which cannot be controlled. Therefore, the battery cellar adjustment amount calculation unit 83 calculates the battery cellar adjustment amount kWh (bat) as the difference [kWh (total)−kWh (DER)] between the total adjustment amount kWh (total) and the DER adjustment amount kWh (DER). In other words, in the present embodiment, after the DER adjustment amount kWh (DER) is determined, the final power adjustment is performed by using the battery cellar adjustment amount kWh (bat). However, for example, when the DER 6 is a storage DER, the battery cellar adjustment amount calculation unit 83 may assign the total adjustment amount kWh (total) to the DER adjustment amount kWh (DER) and the battery cellar adjustment amount kWh (bat), and perform the power adjustment using both the DER adjustment amount kWh (DER) and the battery cellar adjustment amount kWh (bat).

As described above in the present embodiment, the degradation degree of each used battery 9 stored in the storage cabinet 21 is evaluated. Thus, it is possible to effectively utilize the used batteries 9 during the storage period. Further, the charging/discharging of the used battery 9 for evaluating the degradation degree of each used battery 9 is basically performed in response to a DR request from the company server 50. When the number of the used batteries 9 is large, a large amount of electric power is charged or discharged, and the large amount of electric power is exchanged between the battery cellar 2 and the power system 5 in response to a DR request from the company server 50. Thus, the operator of the battery cellar 2 may receive a payment (an incentive) from the power company, and may use the payment as the running cost to run the battery cellar 2. Alternatively, the operator of the battery cellar 2 may recover a part of the initial investment (initial cost) of the battery cellar 2. Thus, it is possible to effectively utilize the used batteries 9 during the storage period for saving money.

Further, according to the present embodiment, at the time of replacing a part of used batteries 9 that have degraded to a certain extent, the used batteries 9 which are predicted to degrade in the near future to such extent are also replaced early. Thus, it is possible to reduce the number of replacements of the used batteries 9 as compared with the case where the early replacement is not performed, which makes it possible to reduce labor and cost for replacing the used batteries 9.

Further, according to the present embodiment, at the time of replacing the used batteries 9 which is predicted to degrade in the near future, the used batteries 9 are preferentially replaced in the ascending order of full charge capacity. Thereby, the full charge capacity of the used battery 9 is greatly recovered along with the replacement. Therefore, when the battery cell 2 functions as a VPP, the amount of electric power that the battery cell 2 can charge or discharge increases, which makes it possible to increase the payment obtained from the power company.

Although the embodiments of the present disclosure have been described as above, it should be understood that the embodiments disclosed herein are illustrative and non-restrictive in every respect. The scope of the present disclosure is defined by the terms of the claims, and is intended to include any modifications within the meaning and scope equivalent to the terms of the claims.

What is claimed is:

1. A battery management system comprising:
   a storage cabinet that stores a plurality of batteries;
   a power converter electrically connected between the plurality of batteries stored in the storage cabinet and a power system; and
   a server that controls the power converter to charge or discharge the plurality of batteries in response to a demand response request from the power system,
   the server selecting, from the plurality of batteries, a first battery, the degradation degree of which has reached a reference value, and a second battery, the degradation degree of which does not reach the reference value but is predicted to reach the reference value within a predetermined period, as replacement target batteries,
   and wherein the first battery includes a battery, the full charge capacity of which is smaller than a reference capacity,
   when replacing the first battery, the server is configured to select, as the replacement target batteries, the second battery, the full charge capacity of which is greater than the reference capacity but is predicted to become smaller than the reference capacity within the predetermined period, in addition to the first battery.

2. The battery management system according to claim 1, wherein
   when the number of batteries, the full charge capacity of each is predicted to become smaller than the reference capacity within the predetermined period, is larger than a predetermined number, the server preferentially selects a battery having a smaller full charge capacity over a battery having a larger full charge capacity as the replacement target battery.

3. The battery management system according to claim 2, wherein
   when the number of batteries, the full charge capacity of each is predicted to become smaller than the reference capacity within the predetermined period, is larger than the predetermined number, the server selects the batteries in the ascending order of full charge capacity as the replacement target batteries.

4. A battery management method using a server, comprising:
   charging or discharging, by the server, a plurality of batteries stored in a storage cabinet in response to a demand response request from a power system
   selecting, by the server, from the plurality of batteries, a first battery, the degradation degree of which has reached a reference value, as a replacement target battery,
   selecting the first battery includes selecting a second battery, the degradation degree of which does not reach the reference value but is predicted to reach the reference value within a predetermined period, as the replacement target battery; and
   wherein the first battery includes a battery, the full charge capacity of which is smaller than a reference capacity,
   when replacing the first battery, the server is configured to select, as the replacement target batteries, the second battery, the full charge capacity of which is greater than the reference capacity but is predicted to become smaller than the reference capacity within the predetermined period, in addition to the first battery.

* * * * *